United States Patent [19]

Olsson et al.

[11] 4,056,776

[45] Nov. 1, 1977

[54] COMBINATION OF A THYRISTOR CONNECTION AND A TEST DEVICE

[75] Inventors: Karl Erik Olsson; Bengt Sehman, both of Ludvika, Sweden

[73] Assignee: ASEA Aktiebolag, Vasteras, Sweden

[21] Appl. No.: 639,805

[22] Filed: Dec. 11, 1975

[30] Foreign Application Priority Data

Dec. 12, 1974 Sweden .............................. 7415574

[51] Int. Cl.$^2$ ...................... G01R 31/22; G01R 31/02
[52] U.S. Cl. .............................. 324/158 SC; 324/51; 324/158 D
[58] Field of Search ........ 324/158 SC, 158 T, 158 D, 324/127, 117 H, 51

[56] References Cited

U.S. PATENT DOCUMENTS

| | | | |
|---|---|---|---|
| 3,199,026 | 8/1965 | Leibowitz | 324/117 H |
| 3,582,774 | 6/1971 | Forgacs | 324/127 |

OTHER PUBLICATIONS

G. E. Controlled Rectifier Manual-1st Ed.; Chapter 12; Mar. 1960; pp. 198-203.

Ruhl, Jr., et al., "A New Rating . . . ;" IEEE Trans. on Ind. App.; Sept./Oct. 1975; pp. 540-545.

Primary Examiner—Rudolph V. Rolinec
Assistant Examiner—Ernest F. Karlsen
Attorney, Agent, or Firm—Watson, Cole, Grindle & Watson

[57] ABSTRACT

A thyristor connection which includes a plurality of thyristors each parallel to a voltage divider and a test device for individual testing of the individual thyristors. The test device includes a feeding circuit and a device for measuring the leakage current in one thyristor. The voltage divider for each thyristor is provided with output terminals for connecting the feeding circuit across a part of the voltage divider during measurement. There is a measuring section in series with such part of the voltage divider for connection of the measurement device. The thyristor connection is provided with an outer voltage divider in parallel with the connection which is provided with an output for connection of a point of the voltage divider to a pole of the feeding circuit.

8 Claims, 8 Drawing Figures

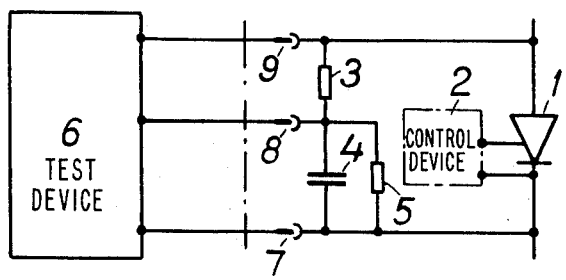
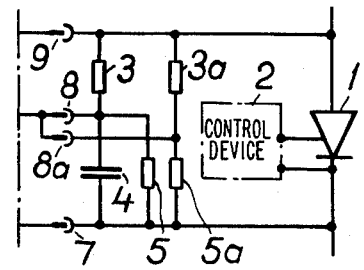
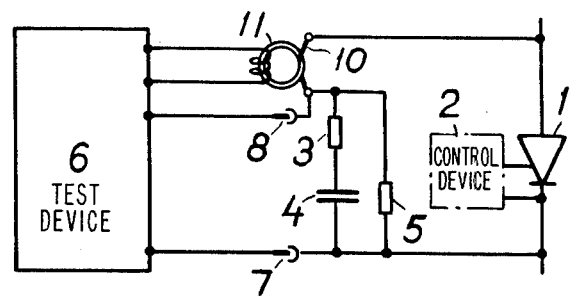
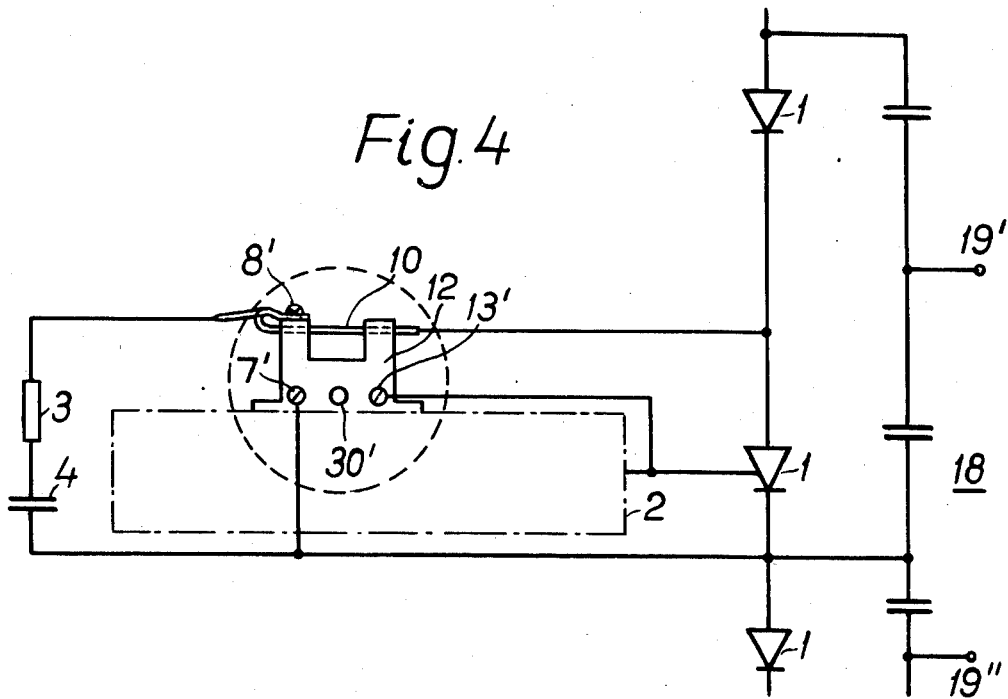

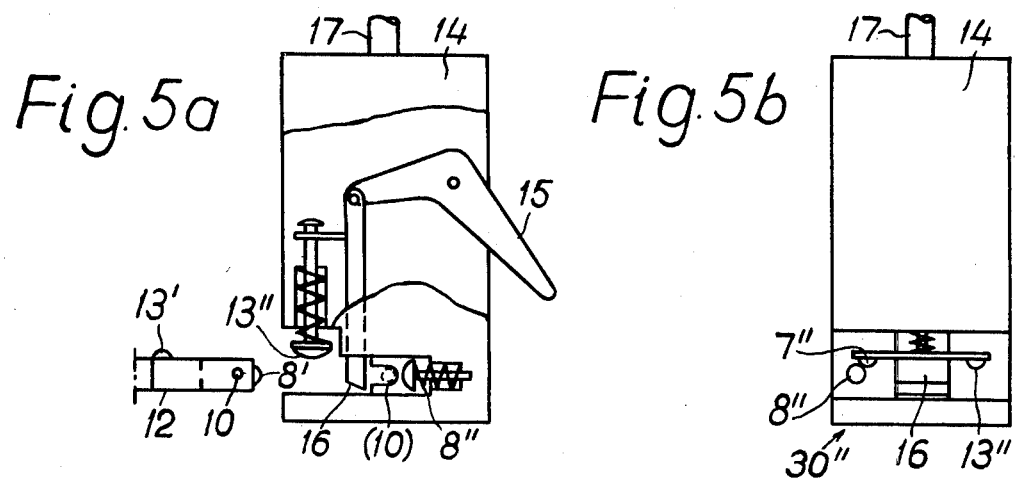
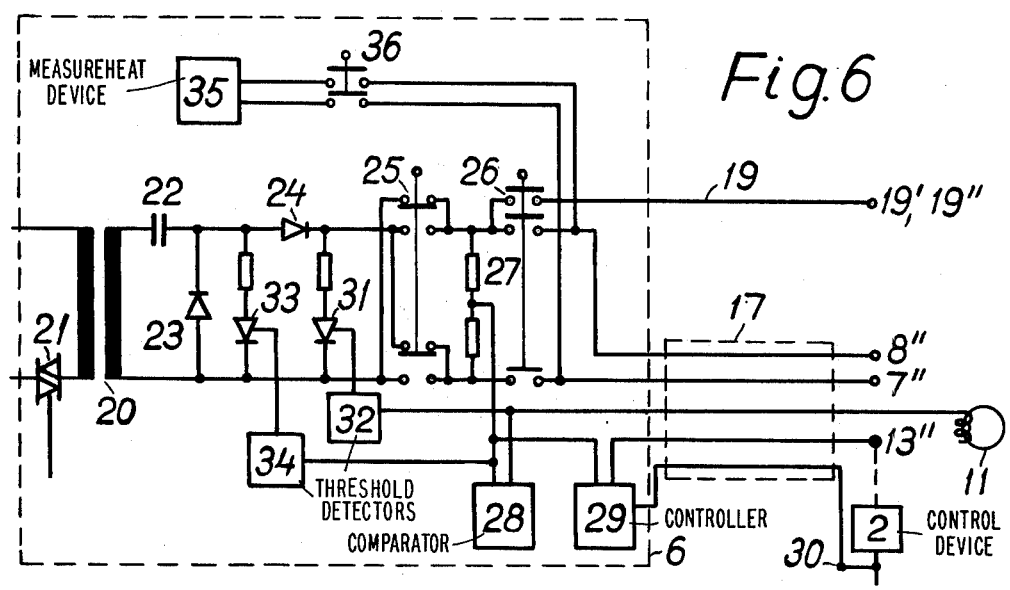
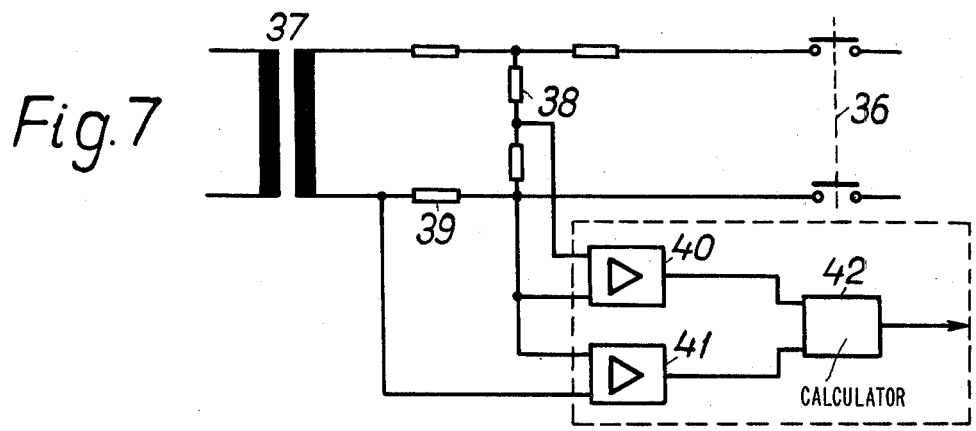

COMBINATION OF A THYRISTOR CONNECTION AND A TEST DEVICE

BACKGROUND OF THE INVENTION

1. Field of the Invention

The present invention relates to a combination of a thyristor connection and a test device, in which the thyristor connection includes a plurality of thyristors each parallel connected to a voltage divider and the test device is provided for individual testing of the individual thyristors.

2. The Prior Art

A thyristor connection of the kind in question may, for example, be a thyristor valve for a high-voltage convertor, which valve comprises a large number of thyristors, sometimes several hundred, in series- and possibly parallel-connection. In parallel with each thyristor there is then a voltage divider, on the one hand for voltage distribution between the thyristors, and on the other for feeding a control device for the thyristor.

In the case of service inspection of such a thyristor valve, it is desirable to measure the blocking capability of the individual thyristors separately in both directions, which is done by measuring the leakage current in the thyristors at a certain voltage. The problem in this connection is, on the one hand, to connect a test voltage in a simple manner, and, on the other hand, to separate the leakage current through the thyristor from the leakage current through the voltage divider. This problem is primarily due to the fact that the control measurement of the many thyristors should take place without time-consuming detachment of parts in the system.

SUMMARY OF THE INVENTION

According to the invention, this problem is solved by providing the thyristor connection with special outputs for separate connection of voltage feed and measuring members. The test device includes a feeding circuit and a device for measuring the leakage circuit in one thyristor. The voltage dividers for each thyristor are provided with output terminals for connecting the feeding circuit at least across a part of the voltage divider during measurement, and a measuring section in series with such part of the voltage divider for connection of the measuring device. The measuring device may be a volt meter and the measuring section includes a part of the voltage divider nearest to the anode of the thyristor and is provided with output terminals for connection of the volt meter. The feeding circuit is connected across another part of the voltage divider in series with the first part. The output for voltage feed and measuring for each thyristor have a predetermined configuration and the test device includes a combined connection device for measurement and voltage feed with a configuration corresponding to that of the outputs. In this way a safe measurement of the leakage current of the thyristors is achieved, and the invention allows a construction involving a simple connection of the test device to each thyristor separately without interfering with the thyristor connection during the control measurement.

BRIEF DESCRIPTION OF THE DRAWINGS

In other respects the invention will be described in more detail with reference to the accompanying drawings, where FIGS. 1 to 3 show various circuits for constructing and connecting together a thyristor connection and a test device, FIGS. 4 and 5a and 5b showing the connecting devices for a thyristor and a test device, respectively, in a more practical embodiment.

FIG. 6 shows in more detail the details of the test device itself.

FIG. 7 shows a detail of FIG. 6.

DESCRIPTION OF THE PREFERRED EMBODIMENTS

FIG. 1 shows part of a thyristor connection comprising a thyristor 1 with the appropriate control device 2 and voltage divider consisting of resistors 3,5 and capacitor 4. Such a thyristor may, for example, be included in a thyristor valve for high voltage, where a large number of thyristors with voltage dividers are connected in series. In order to control the blocking ability of the thyristor in both directions, it is necessary to apply a voltage across the anode-cathode of the thyristor and to measure the corresponding leakage current which must thus be confined within certain given limits which are characteristic of the particular thyristor. Reversely, the voltage can be increased from a low value to such a value that a certain stipulated leakage current flows, which must not occur until a certain high predetermined voltage level has been reached. In both cases the current and the voltage should be kept within the limits which are sufficient for establishing that the thyristor is faultless.

In order to be able to perform the control measurement in a simple manner, according to the invention, the voltage divider is provided with outputs 7, 8, 9 for example in the form of plug contacts for connection of a test device 6 which will be described in more detail below. This contains, on the one hand, a voltage source for feeding a voltage across the plug contacts 7, 8, and, on the other hand, a measurement device for measuring the voltage across the plug contacts 8, 9. By calibrating this voltage measurement in relation to the value R of the resistor 3, the leakage current flowing through the thyristor by way of the plug contacts 7, 8 can be directly recorded. By providing each thyristor in the connection with plug contacts 7 to 9 in a certain configuration and arranging the connections to the test device 6 in a corresponding configuration, suitably by a handle, it is possible in a simple and easy manner to connect the test device to one thyristor after the other, and to have a rapid control of the whole series of thyristors without detaching any single connection in the thyristor connection. It is true that the resistors 3 may display slight variations in the resistance value R, but this is of minor importance since it is not the exact value of the leakage current that is of interest, but the fact that the leakage current is kept below a certain allowable limit.

FIG. 2 shows part of a thyristor connection approximately as in FIG. 1, where there is an extra voltage divider 3a, 5a in parallel with the first one. This is provided with an output 8a which, when the test device 6 is to be connected (not shown), is connected together with the output 8, the resistors 3 and 3a then being connected in parallel and forming a measurement path for the measurement device of the test device. This should then be calibrated for the combined resistance value R1, R2 of the resistors 3 and 3a. Without the additional output 8a, the voltage divider 3a, 5a would form a leakage path for the current through the outputs 7 and 8, which would result in an incorrect measurement result.

FIG. 3 shows a slightly different embodiment, in which the measurement path 10 in series with the voltage divider 3, 4, 5 consists of a part of the anode connection from the voltage divider to the thyristor 1. The measurement device in the test device 6 is constructed as a clip-on ammeter 11 which grasps the measuring path 10 and directly reads off the leakage current through the thyristor.

For the embodiment according to FIG. 3, FIGS. 4 and 5 show a more practical construction of the thyristor connection and a corresponding test handle, respectively.

FIG. 4 shows part of the thyristor connection with a thyristor 1 and the appropriate control device 2. This control device may be constructed, for example, according to U.S. Pat. No. 3,821,564, and it is suitably enclosed in a box beside the thyristor. At the side of this box there may be arranged an insulating connection piece 12 for connection of a test handle according to FIG. 5 and containing the required output contacts from the thyristor circuit. The connection piece 12 is then provided with cathode and anode connections 7' and 8', respectively, as in FIG. 3, and a measuring section 10 in the form of a stiff conductor at the side of the connection piece 12. The measuring section 10 constitutes part of the anode connection. Further there is a contact element 13' connected to the control electrode of the thyristor for controlling the firing properties of the thyristor.

FIGS. 5a and 5b show a test handle 14 seen from two different sides with contact elements 7", 8", 13" corresponding to 7', 8', 13' in FIG. 4. FIG. 5a shows the contact piece 12 before being connected. The voltage is fed through the contacts 7" and 8", the measurement device having the characteristics of a clip-on ammeter. For opening this, the test handle is provided with a grip 15, by means of which one of the jaws 16 of the meter together with the spring-loaded contact elements 7", 13" are lifted up so that the handle may be fitted over the connection piece 12 with the measuring section 10. In this condition the spring-loaded contact element 8" is pressed against 8' on the connection piece 12. From the handle 14 a cable 17 leads to the test equipment itself with feeding devices and measurement devices, as shown in FIG. 6.

FIG. 6 shows the test device 6 according to FIG. 3 with the connection cable 17 to the test handle 14 according to FIG. 5. The voltage feed takes place by way of a transformer 20, which is connected and disconnected by a connection member 21, for example a so-called triac. By means of a capacitor 22 and a diode 23, the transformer power is converted into DC pulses which are fed to the contact elements 7", 8" by way of the diode 24 and a pole reverser 25 and the cable 17, and thus to the anode and cathode of the thyristor 1. By switching over the pole reverser 25, the leakage current in the thyristor can be measured in both directions. With the aid of an extra breaker 26 the components 20-25 can be disconnected.

In parallel with the anode conductor over the contact element 8" there is an additional conductor 19, the importance of which is clear from FIG. 4. As shown in FIG. 4, the series connection of thyristors 1 is often parallel-connected to an outer, capacitive voltage divider 18, which is connected to a number of points between the thyristors and which could give rise to a leakage current parallel to the leakage current through the thyristor that is to be measured. To avoid this, the different sections of the voltage divider 18 between the connections to the thyristor chain are provided with outputs 19', 19" for connection of the line 19, the voltage divider 18 being fixed to the anode potential of the thyristors during measuring. In this way there will be no tendency of a leakage current across the voltage divider 18. The line 19 can be connected at the beginning of the measuring and can remain until all the thyristors have been measured.

Between the reverser 25 and the breaker 26 there is a voltage divider 27 for measuring the feed voltage. The treatment of the measurement results appears from the lower part of FIG. 6.

The values of the voltage and leakage current measurements are fed to a first block 28 for comparison. The block 28 may be formed as a registering device which records the measurement values for each thyristor separately and possibly calculates the relation between the two measurement values, and it may also comprise a discriminator or threshold value emitter which emits a signal when the leakage current is too high in relation to the feed voltage.

To a second block 29 there can be fed, on the one hand, the control pulse to the control device 2, and, on the other hand, by way of the terminal 13", the output pulse from said control device to the thyristor 1 and also the voltage from 27. In this way it is possible to register the pulses coming to and leaving the control device 2 as well as voltage breakdowns across the thyristor, and thus the different times of the whole ignition process. For this purpose the control device 2 should be provided on its input side with a contact element 30 for connection to the test handle 14. For simplicity's sake, however, this has not been shown in FIG. 5.

To avoid too high currents or voltages during the testing, the transformer 20 is provided on its output side with short-circuit thyristors 31 and 33 controlled by threshold value emitters 32, 34 and affected by the current value from 11 and the voltage value from 27, respectively. device 35 which can be connected, by way of a breaker 36, to the contacts 7, 8 for control of the voltage divider capacitor 4 according to FIGS. 1-3.

The device 35 is shown in more detail in FIG. 7 and consists simply of an alternating voltage source in the form of a transformer 37, a measuring voltage divider 38 and a measuring shunt 39 for measuring voltage and current in the capacitor 4. The measurement values are rectified in rectifiers 40, 41 and are connected to a memeber 42 for calculating the capacitance value.

Measuring of the thyristors 1 should take place at their rated voltage values or therearound, whereas the measuring of the capacitors may be performed at considerably lower voltages. Suitably all measurements are registered, so that these may be performed by unskilled personnel.

We claim:
1. A combination comprising:
   a plurality of serially connected thyristor devices, each said thyristor device including a voltage divider and each voltage divider being parallelly connected to an associated thyristor in each of said thyristor devices;
   a test device for testing the individual thyristors in place in the serially connected thyristor devices and including a voltage source and means for measuring the leakage current in an individual thyristor; and said voltage divider of each thyristor device including first connection means for removable connection of said voltage source across at least a part of said voltage divider, a measuring section connected in series with said at least part of said voltage divider and second connection means for removable connection of said measuring section to said means for measuring.

2. A combination according to claim 1, in which said means for measuring includes a voltmeter and said measuring section further including resistance means forming a part of said voltage divider and connected to the anode of the thyristor under test and, said voltage source being connected across another part of said voltage divider in series with said resistance means.

3. A combination according to claim 1, said measuring section including a part of the connection between said voltage divider part and the anode of the thyristor under test, said means for measuring being a clip-on ammeter arranged to grip around said measuring section.

4. A combination according to claim 1, said first and second connection means being plug contacts.

5. A combination according to claim 1, said first and second connection means having a predetermined configuration and said test device further including a combined connection device including said voltage source, said means for measuring and third connection means engageable with said first and second connection means.

6. A combination according to claim 1, in which said voltage source is energized from an AC power source and includes a converter to generate DC voltage pulses and a pole reverser for reversing the polarity of said DC voltage pulses.

7. A combination according to claim 1, further comprising second voltage dividers each connected in parallel with adjacent series connected thyristors, said second voltage dividers each including an output terminal for connection of a node of said second voltage divider to said voltage source.

8. A combination according to claim 1, wherein said test device further includes an alternating voltage source for connection to said voltage divider through said first connection means and second means for measuring the capacitance of said voltage divider.

* * * * *